(12) United States Patent
Fusaro et al.

(10) Patent No.: US 6,833,609 B1
(45) Date of Patent: Dec. 21, 2004

(54) INTEGRATED CIRCUIT DEVICE PACKAGES AND SUBSTRATES FOR MAKING THE PACKAGES

(75) Inventors: James M. Fusaro, Scottsdale, AZ (US); Robert F. Darveaux, Higley, AZ (US); Pablo Rodriguez, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/354,772

(22) Filed: Jan. 30, 2003

Related U.S. Application Data

(63) Continuation of application No. 09/434,589, filed on Nov. 5, 1999, now Pat. No. 6,580,159.

(51) Int. Cl.[7] .................. H01L 23/38; H01L 23/52; H01L 29/40
(52) U.S. Cl. .................. 257/668; 257/676; 257/737; 257/784; 257/787
(58) Field of Search .................. 257/668, 676, 257/737, 784, 787

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,646,710 A | 3/1987 | Schmid et al. |
| 4,707,724 A | 11/1987 | Suzuki et al. |
| 4,737,839 A | 4/1988 | Burt |
| 4,756,080 A | 7/1988 | Thorp, Jr. et al. |
| 5,168,368 A | 12/1992 | Gow, 3rd et al. |
| 5,365,106 A | 11/1994 | Watanabe |

(List continued on next page.)

FOREIGN PATENT DOCUMENTS

| | | |
|---|---|---|
| DE | 19734794 A1 | 7/1997 |
| EP | 54021117 | 6/1978 |
| EP | 59050939 | 3/1984 |

(List continued on next page.)

OTHER PUBLICATIONS

JEDEC Solid State Product Outline, "2 Lead Header Family Surface Mounted (Peripheral Terminals)", 4 pages.

(List continued on next page.)

*Primary Examiner*—David E. Graybill
(74) *Attorney, Agent, or Firm*—Stetina Brunda Garred & Brucker

(57) ABSTRACT

Integrated circuit device packages and substrates for making the packages are disclosed. One embodiment of a substrate includes a planar sheet of polyimide having a first surface, an opposite second surface, and apertures between the first and second surfaces. A planar metal die pad and planar metal are attached to the second surface of the polyimide sheet. The apertures in the polyimide sheet are juxtaposed to the leads. A package made using the substrate includes an integrated circuit device mounted above the first surface of the polyimide sheet opposite the die pad. Bond wires are connected between the integrated circuit device and the leads through the apertures in the polyimide sheet. An encapsulant material covers the first surface of the polyimide sheet, the integrated circuit device, the bond wires, and the apertures. The die pad and leads are exposed at an exterior surface of the package.

18 Claims, 13 Drawing Sheets

U.S. PATENT DOCUMENTS

| | | | |
|---|---|---|---|
| 5,592,019 | A | 1/1997 | Ueda et al. |
| RE36,613 | E | 3/2000 | Ball |
| 6,113,473 | A | 9/2000 | Costantini et al. |
| RE36,907 | E | 10/2000 | Templeton, Jr. et al. |
| 6,215,179 | B1 * | 4/2001 | Ohgiyama .................. 257/676 |
| 6,247,229 | B1 * | 6/2001 | Glenn .......................... 29/841 |
| 6,295,977 | B1 | 10/2001 | Ripper et al. |
| 6,307,272 | B1 | 10/2001 | Takahashi et al. |
| 6,369,454 | B1 | 4/2002 | Chung |
| 6,482,680 | B1 | 11/2002 | Khor et al. |
| 6,507,120 | B2 | 1/2003 | Lo et al. |
| 2001/0008305 | A1 | 7/2001 | McLellan et al. |
| 2002/0011654 | A1 | 1/2002 | Kimura |
| 2002/0024122 | A1 | 2/2002 | Jung et al. |
| 2002/0140061 | A1 | 10/2002 | Lee |
| 2002/0140068 | A1 | 10/2002 | Lee et al. |

FOREIGN PATENT DOCUMENTS

| | | |
|---|---|---|
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 63205935 | 8/1988 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 4098864 | 3/1992 |
| JP | 5129473 | 5/1993 |
| JP | 5166992 | 7/1993 |
| JP | 5283460 | 10/1993 |
| JP | 692076 | 4/1994 |
| JP | 6260532 | 9/1994 |
| JP | 7297344 | 11/1995 |
| JP | 7312405 | 11/1995 |
| JP | 864634 | 3/1996 |
| JP | 8125066 | 5/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10199934 | 7/1998 |
| JP | 10256240 | 9/1998 |
| JP | 10022447 | 10/1998 |
| JP | 00150765 | 5/2000 |
| KR | 941979 | 1/1994 |
| KR | 199772358 | 11/1997 |
| KR | 100220154 | 6/1999 |
| KR | 0049944 | 6/2002 |
| WO | 9956316 | 11/1999 |
| WO | 9967821 | 12/1999 |

OTHER PUBLICATIONS

Mannion, P., "MOSFETs Break Out of the Shackles of Wirebonding", Electronic Design, vol. 47, #6 (Mar. 22, 1999).

Micro Electronics Packaging Handbook, 1989, edited by R. Tummala & E. Rymaszewski, published by Van Nostrand Reinhold, NewYork, NY.

National Semiconductor Application Note 1187, "Leadless Leadframe Package (LLP)", Oct., 2002, http://www.national.com/an/AN/AN-1187.pdf.

Vishay Siliconix Press Release, http://www.siliconix.com/www/200/pr98/4430.html, Dec. 9, 1998, pp. 1-3.

* cited by examiner

INTEGRATED CIRCUIT DEVICE PACKAGES AND SUBSTRATES FOR MAKING THE PACKAGES

CROSS-REFERENCE TO RELATED APPLICATION

The present application is a continuation of U.S. application Ser. No. 09/434,589 entitled INTEGRATED CIRCUIT DEVICE PACKAGES AND SUBSTRATES FOR MAKING THE PACKAGES filed Nov. 5, 1999 now U.S. Pat. No. 6,580,159.

FIELD OF THE INVENTION

The present invention concerns packages for an integrated circuit device, substrates for making such packages, and methods of making the packages and substrates.

BACKGROUND OF THE INVENTION

U.S. Pat. No. 5,859,475 to Freyman et al. describes several ball grid array style packages for an integrated circuit device. The packages include a thin planar polyimide sheet. In one embodiment, a die pad and metal traces are formed on the upper surface of the polyimide sheet. An integrated circuit device is mounted on the die pad and is connected by bond wires to the metal traces. Metallized vias extend through the polyimide sheet and connect the metal traces on the upper surface of the sheet to metal traces on the opposite lower surface of the sheet. Solder balls are connected to the metal traces on the lower surface of the polyimide sheet. In another embodiment, a die pad and metal traces are formed on the upper surface of the polyimide sheet. The metal traces terminate in a metal land. Solder balls are directly attached to the backside of the metal land through apertures in the polyimide sheet. In both of these embodiments, bond wires, solder balls, metal traces, and metal-filled vias are used. Each of these features contribute to the cost of a package, and thus elimination of any of them will reduce costs. In addition, the packages do not include a means for enhanced thermal performance.

SUMMARY OF THE INVENTION

The present invention improves on the prior art by providing integrated circuit device packages that are thinner than conventional packages and have improved thermal performance. The packages and the substrates and methods of making them also are reliable, and cost effective in that the substrates and packages are assembled using conventional materials and equipment.

One embodiment of a substrate within the present invention includes a planar nonconductive sheet having a first surface, an opposite second surface, and first apertures between the first surface and second surface. The nonconductive sheet may be polyimide, plastic, or an epoxy laminate. The substrate also includes a planar metal die pad and planar metal leads. The die pad and leads each have a first surface and an opposite second surface. The first surfaces of the die pad and leads are attached to the nonconductive sheet. Each first aperture in the nonconductive sheet is juxtaposed with the first surface of a lead.

Packages made using the inventive substrates also are within the present invention. One embodiment of a package within the present invention includes an integrated circuit device that is mounted above the first surface of the die pad. Bond wires are conductively connected between the integrated circuit device and the first surface of the leads through the first apertures in the nonconductive sheet. An encapsulating material on the first surface of the nonconductive sheet covers the integrated circuit device, the bond wires, and the first apertures. The second surfaces of the die pad, leads, and nonconductive sheet are exposed at a lower exterior surface of the package.

These and other embodiments of the invention are described in greater detail below.

DETAILED DESCRIPTION

Similar features in the various figures are identified using the same reference numbers, and redundant discussion is omitted.

Figure 1:
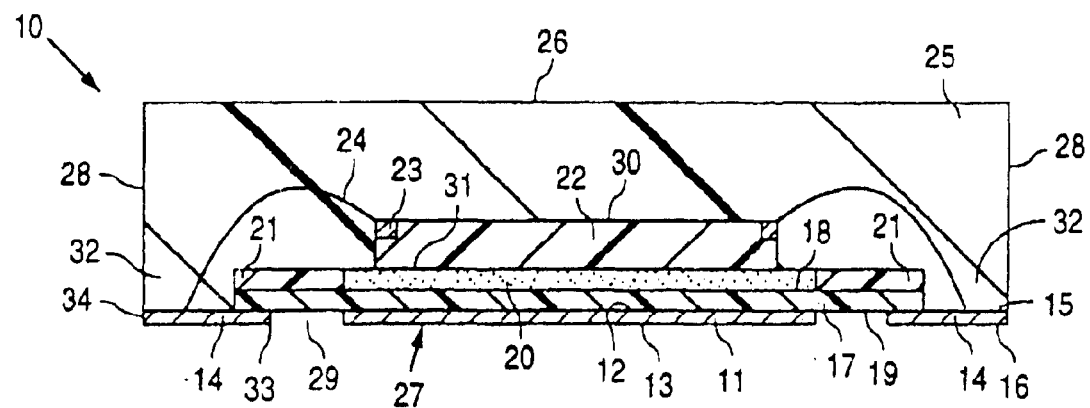
FIG. 1 is a cross-sectional side view of an exemplary package 10, wherein a nonconductive sheet 17 extends beneath an integrated circuit device 22.

FIG. 1 depicts an embodiment of a package 10 within the present invention. Package 10 includes a package body formed of an insulative encapsulant material 25. Package 10 includes an upper exterior first surface 26, an opposite lower exterior second surface 27, and orthogonal exterior side surfaces 28 between first surface 26 and second surface 27.

Lower second surface 27 of package 10 includes an exposed planar metal die pad 11 and exposed planar metal leads 14. Die pad 11 includes a planar upper first surface 12 and opposite planar lower second surface 13. Leads 14 each include a planar upper first surface 15 and a planar lower second surface 16. Leads 14 are in the same horizontal plane as die pad 11.

Leads 14 of package 10 of FIG. 1 extend laterally on lower surface 27 from package side 28 toward die pad 11. In particular, leads 14 include a first end 33 adjacent to die pad 11 and an opposite second end 34 coincident with package side 28. A space 29 at lower surface 27 is between the peripheral sides of die pad 11 and first end 33 of each lead 14.

Lower second surface 16 of each lead 14 is exposed for external connection to a printed circuit board or other substrate (not shown). Lower second surface 13 of die pad 11 also is exposed and, in particular embodiments, is connected to a ground voltage source and/or heat sink on the printed circuit board or other substrate.

Figure 1A:
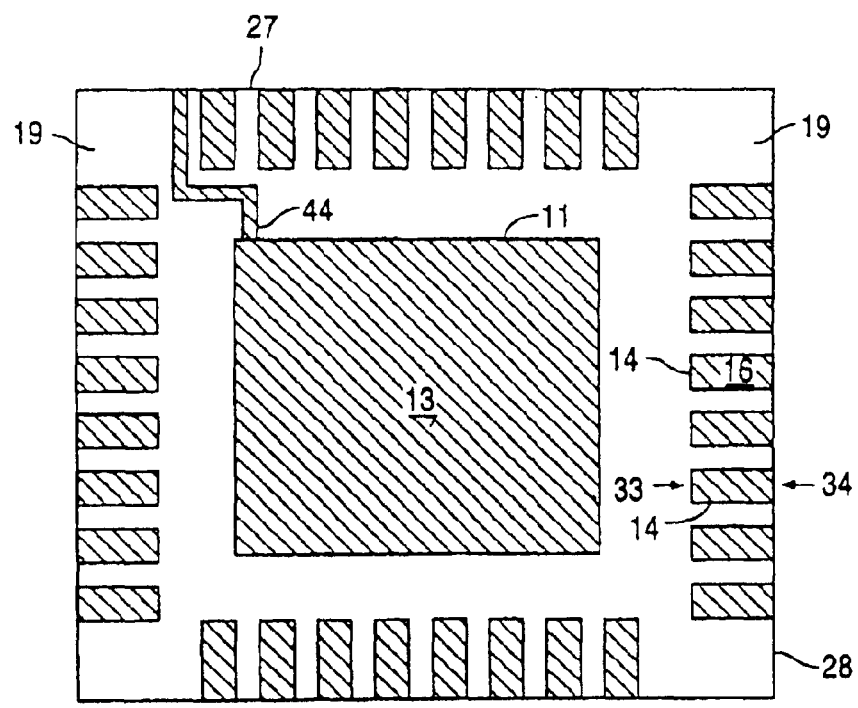
FIG. 1A is a plan view of a lower exterior surface 27 of package 10 of FIG. 1.

FIG. 1A is a plan view of lower surface 27 of package 10 of FIG. 1. Shading is used in FIG. 1A to highlight metal features. As shown, thirty-two leads 14 surround die pad 11. A metal plating trace 44 is integrally connected to die pad 11 and extends to a package side 28. In an alternative embodiment, leads 14 are adjacent to two parallel sides of 28 package 10, rather than adjacent to all four sides 28.

Die pad 11 and leads 14 are formed of a metal conventionally used in packaging, such as copper or a copper alloy. The surfaces of die pad 11 and leads 14 are plated with other metals, such as nickel and gold, to enhance solder connections.

Package 10 of FIG. 1 also includes a thin planar nonconductive sheet 17. Sheet 17 has a planar upper first surface 18 and an opposite planar lower second surface 19. Second surface 19 is attached to upper first surface 15 of leads 14 and upper first surface 12 of die pad 11. Referring to FIG. 1A, second surface 19 of sheet 17 is exposed at lower surface 27 of package 10 beneath die pad 11 and leads 14.

Referring to FIG. 1, lower second surface 19 of sheet 17 is attached to and extends over the entire area of upper first surface 12 of die pad 11. Second surface 19 of sheet 17 also is attached to a peripheral portion of upper first surface 15 of leads 14. An aperture 32 in sheet 17 is juxtaposed with a central portion of upper first surface 15 of each lead 14. A bond wire 24 extends through each aperture 32 and connects integrated circuit device 22 to first surface 15 of each lead 14.

Sheet 17 can be formed of a variety of materials. In addition to being thin and nonconductive, the material selected for sheet 17 should: (1) be able to withstand chemical processes (such as plating or chemical etching); (2) be able withstand heat typical of surface mount solder reflow processes; (3) be dimensionally stable; (4) be able to withstand the formation of via holes without tearing; and (5) have a low ionic content. In the embodiment of FIG. 1, nonconductive sheet 17 is formed of a conventional polyimide film. Example brands of polyimide film include UPILEX polyimide film from the UBE Company and KAPTON polyimide film from the DuPont Company. Alternatively, nonconductive sheet 17 may be formed of other plastic materials, fiber-reinforced epoxy laminate, MYLAR, KEVLAR, woven aramid, BT laminate, or other conventional materials.

Referring to FIG. 1, an integrated circuit device 22 is mounted on a central portion of first surface 18 of nonconductive sheet 17. Integrated circuit device 22 includes an upper first surface 30 and an opposite lower second surface 31. Lower second surface 31 of integrated circuit device 22 is attached to first surface 18 of sheet 17 with an adhesive material 20. Conventional materials may be used as adhesive 20. These include conductive or nonconductive epoxy resins. Alternatively, a conventional adhesive film may be used to attach integrated circuit device to first surface 18 of sheet 17.

In package 10 of FIG. 1, a ring of solder mask material 21 surrounds adhesive 20 on first surface 18 of sheet 17. Conventional solder mask material can be used. Alternatively, a resin dam can be used in place of solder mask 21. The purpose of solder mask 21 or an alternative resin dam is to prevent any bleeding of adhesive material 20 onto upper first surface 15 of leads 14. If an adhesive is used that does not experience such problems, solder mask 21 may be omitted.

Integrated circuit device 22 includes a plurality of metal bond pads 23 that are conductively connected to the internal circuitry of device 22. Each bond pad 23 is conductively connected by a conductive bond wire 24 to an upper surface 15 of a lead 14 through an aperature 32 in sheet 17. Bond wire 24 may be gold, copper, or other conductive materials. Accordingly, the internal circuitry of integrated circuit device 22 is conductively connected to leads 14.

The dimensions of package 10 will vary depending upon the application, but a particular advantage of package 10 is its low profile. The height of package 10 may be on the order of 0.700 mm or less. In such a package, leads 14 and die pad 11 have a height of 0.050 mm. Nonconductive sheet 17 has a height of 0.100 mm. Adhesive material 20 has a height of 0.025 mm. Integrated circuit device 22 has a height of 0.225 mm. Bond wires 24 extend 0.125 mm above upper first surface 30 of integrated circuit device 22. Finally, a clearance of 0.175 mm is between the apex of bond wire 24 and external top surface 26 of package 10. Of course, these dimensions are exemplary only and will vary depending on the application.

Figure 2:
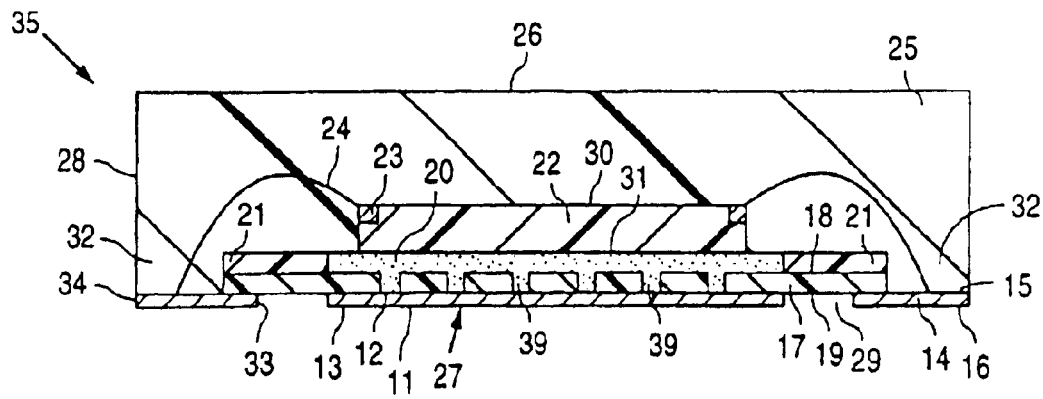
FIG. 2 is a cross-sectional side view of an exemplary package 35, wherein nonconductive sheet 17 extends beneath integrated circuit device 22 and includes a plurality of small apertures 39 between integrated circuit device 22 and a die pad 11.

FIG. 2 depicts an alternative package 35 within the present invention. Package 35 is identical to package 10 of FIGS. 1 and 12 except for a change in the configuration of nonconductive sheet 17. As in package 10 of FIG. 1, sheet 17 is attached to and extends across upper first surface 12 of die pad 11. In package 35 of FIG. 2, however, sheet 17 includes a plurality of small apertures 39 between integrated circuit device 22 and first surface 12 of die pad 11. An example diameter of an aperture 39 is 0.25 mm, although the diameter can vary if desired or required to be another size. A thermally conductive adhesive 20 fills aperatures 39. Apertures 39 provide a thermally conductive path between lower second surface 31 of integrated circuit device 22 and die pad 11. Package 35 of FIG. 2 has enhanced thermal performance as a result of apertures 39.

Figure 3:
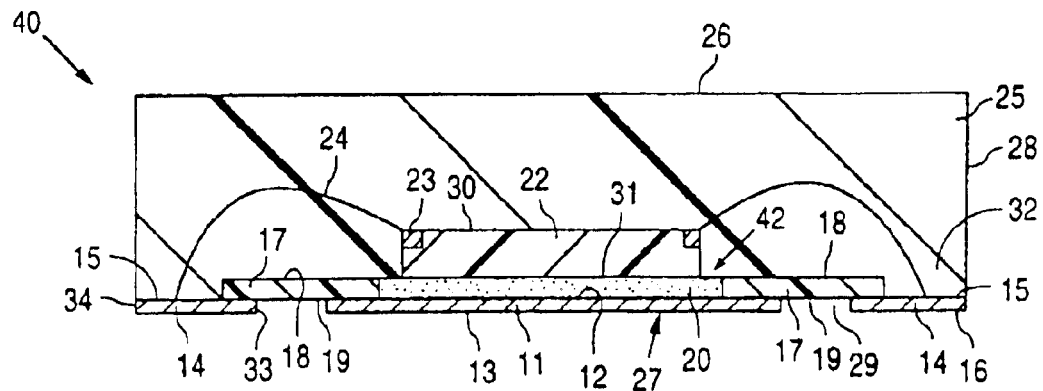
FIG. 3 is a cross-sectional side view of an exemplary package 40, wherein integrated circuit device 22 is within an aperture 42 in nonconductive sheet 17 and is attached to die pad 11 by adhesive 20.

FIG. 3 depicts an alternative package 40 within the present invention. Package 40 is identical to package 10 of FIG. 1, except for a change in the configuration of nonconductive sheet 17. In FIG. 3, nonconductive sheet 17 includes a large central aperture 42 between first surface 18 and second surface 19 of sheet 17. Adhesive 20 and integrated circuit device 22 are within aperture 42. Lower second surface 31 of device 22 is directly attached by adhesive 20 to the central area of upper first surface 12 of die pad 11. Adhesive 20 is thermally conductive. Advantages of package 40 of FIG. 3 relative to package 10 of FIG. 1 include a lower profile (e.g., 0.600 mm verses 0.700 mm) and enhanced thermal performance.

Figure 4:
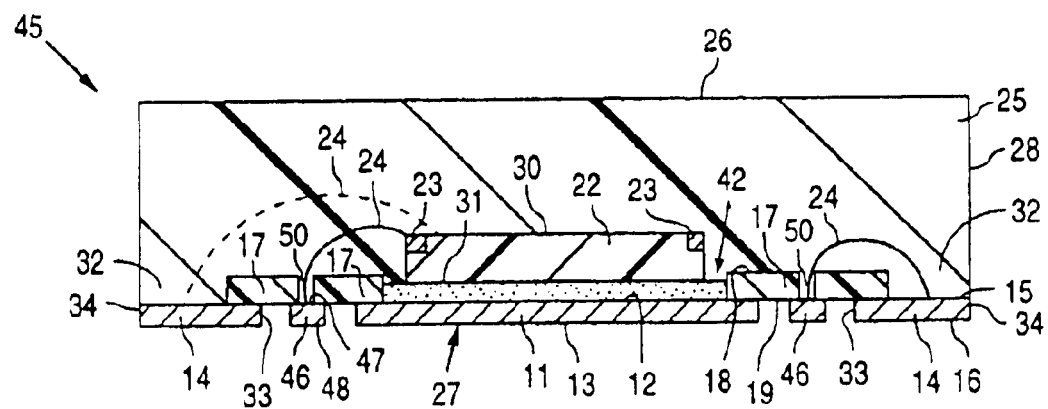
FIG. 4A is a plan view of a first embodiment of lower exterior surface 27 of package 45 of FIG. 4, wherein a metal strip 46 substantially surrounds die pad 11.
FIG. 4B is a plan view of a second embodiment of lower surface 27 of package 45 of FIG. 4, wherein an alternative metal strip 46A surrounds die pad 11.

FIG. 4 depicts an alternative package 45 within the present invention. Package 45 is identical to package 40 of FIG. 3, except for the presence of a planar metal strip 46 at lower surface 27 of package 45 and an associated change in the configuration of nonconductive sheet 17.

Referring to package 45 of FIG. 4, metal strip 45 is located between die pad 11 and leads 14, and is in the same horizontal plane as die pad 11 and leads 14. planar metal strip 46 at lower surface 27 of package 45 and an associated change in the configuration of nonconductive sheet 17.

Referring to package 45 of FIG. 4, metal strip 46 is located between die pad 11 and leads 14, and is in the same horizontal plane as die pad 11 and leads 14. Metal strip 46 includes a planar upper first surface 47 and an opposite planar lower second surface 48. Upper first surface 47 of strip 46 is attached to nonconductive sheet 17. One or more apertures 50 in nonconductive sheet 17 are juxtaposed with first surface 47 of strip 46. Lower second surface 48 of strip 46 is exposed at lower surface 27 of package 45.

Figure 4A:
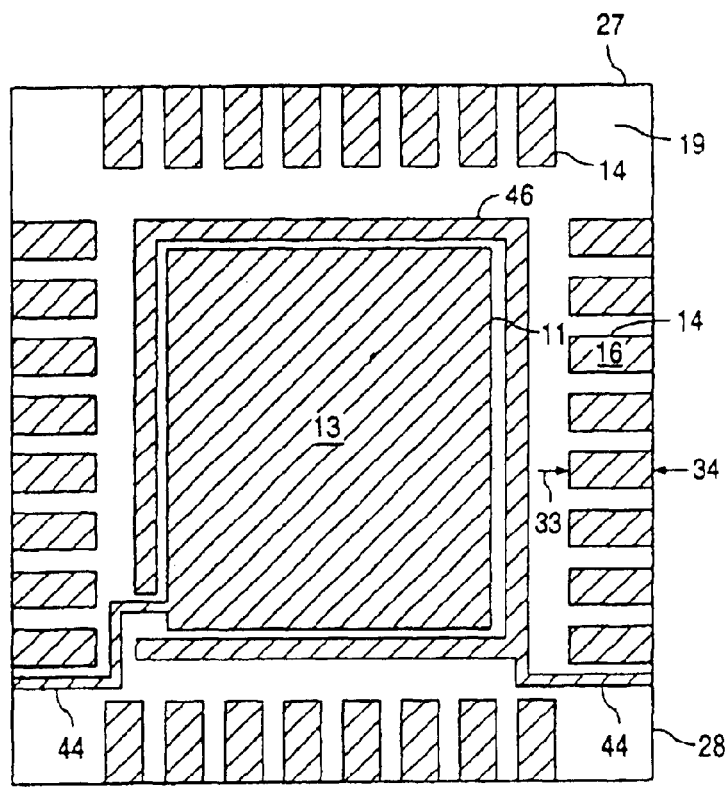
Figure 4B:
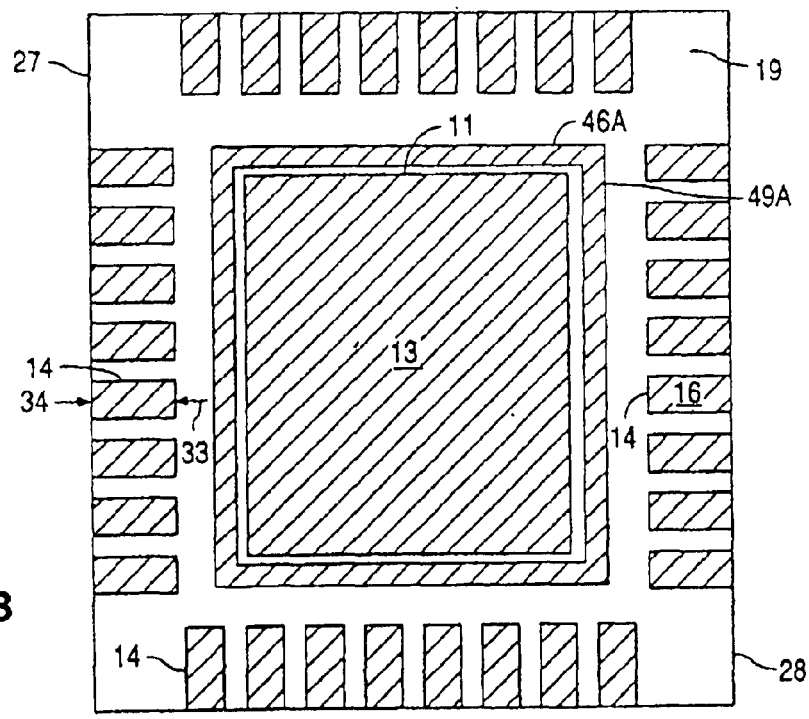

FIG. 4A shows a first embodiment of lower second surface 27 of package 45 of FIG. 4. In FIG. 4A, metal, strip 46 extends substantially, but not fully, around die pad 11. A plating trace 44 extends from metal strip 46 to a package side 28. FIG. 4B is an alternative embodiment of lower second surface 27 of package 45 of FIG. 4. In FIG. 4B, metal strip 46A surrounds die pad 11. No plating traces are present in FIG. 4B. Thus, an electrodeless plating process would be required to plate the metal surfaces.

Package 45 of FIG. 4 includes bond wires 24 (shown by a dashed line) that conductively connect each bond pad 23 on integrated circuit device 20 to upper surface 15 of leads 14 through an aperture 32 in sheet 17, as in FIG. 1. Package 45 also includes conductive connections between metal strip 46 and integrated circuit device 22 and leads 15. For example, on the right side of package 45, a first bond wire 24 is conductively connected between a first surface 15 of a lead 14 and upper surface 47 of metal strip 46. The bond wire 24 extends through apertures 32 and 50 in nonconductive sheet 17. On the left side of package 45, another portion of metal strip 46 is conductively connected by a second bond wire 24 through an aperture 50 to a bond pad 23 on integrated circuit device 22. When package 45 is connected to a printed circuit board (not shown), a power or ground voltage is conducted from lead 14 to strip 46 via the first bond wire 24, and the second bond wire 24 conducts that voltage from another portion of strip 46 to a bond pad 23 of integrated circuit device 22. Alternatively, instead of having strips 46 or 46A conductively connected to a voltage source via a lead 14 and a bond wire 24, lower second surface 48 of strip 46 may be directly connected to a power or ground voltage source on the printed circuit board. In such an embodiment, a bond wire 24 conducts the voltage from strip 46 or 46A to a bond pad 23 on integrated circuit device 22, as in FIG. 4.

In a further alternative embodiment (not shown), a lead 14 is extended so as to integrally connect with metal strip 46 of FIG. 4A or metal strip 46A of FIG. 4B. Such an integral connection provides additional support. for strips 46 or 46A and allows conduction of a voltage from the lead to strip 46 or 46A without the necessity of a bond wire 24.

While the embodiments of FIGS. 4A and 4B show a single metal strip 46 or 46A, respectively, around die pad 11, the number of strips 46 or 46A can be multiplied in alternative embodiments so that multiple voltages can be supplied to integrated circuit device 22. Additional apertures 50 would be required in sheet 17 to allow bond wire connections to the additional metal strips.

Figure 5:
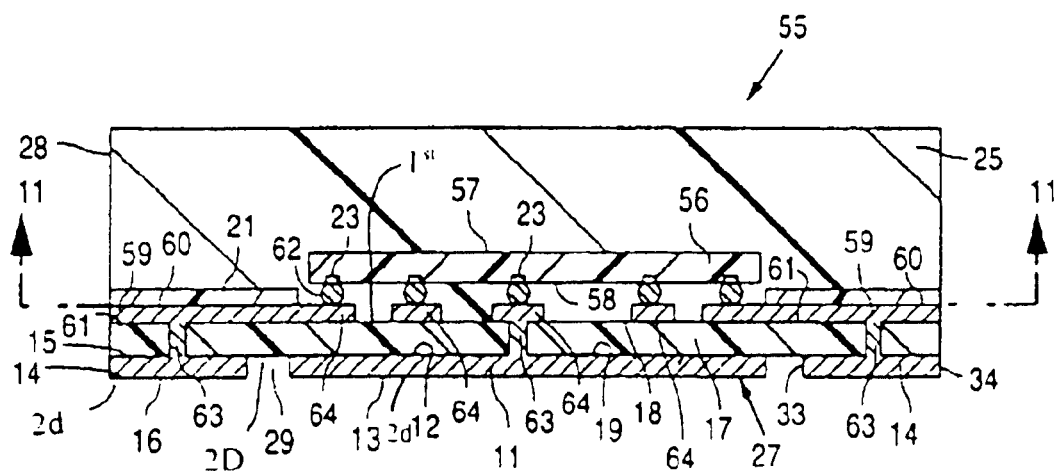
FIG. 5 is a cross-sectional side view of an exemplary package 55, wherein a flip-flop integrated circuit device 56 is mounted above nonconductive sheet 17 and die pad 11.

FIG. 5 depicts an alternative embodiment of a package 55 within the present invention. Package 55 has features in common with package 10 of FIG. 1, but includes additional features that allow the use of a flip-chip style integrated circuit device 56.

Flip chip integrated circuit device 56 of FIG. 5 includes a upper first surface 57 and an opposite lower second surface 58. A plurality of bond pads 23 are on second surface 58. Bond pads 23 are arranged in four rows, with each row along a side of flip chip device 56.

Figure 11:
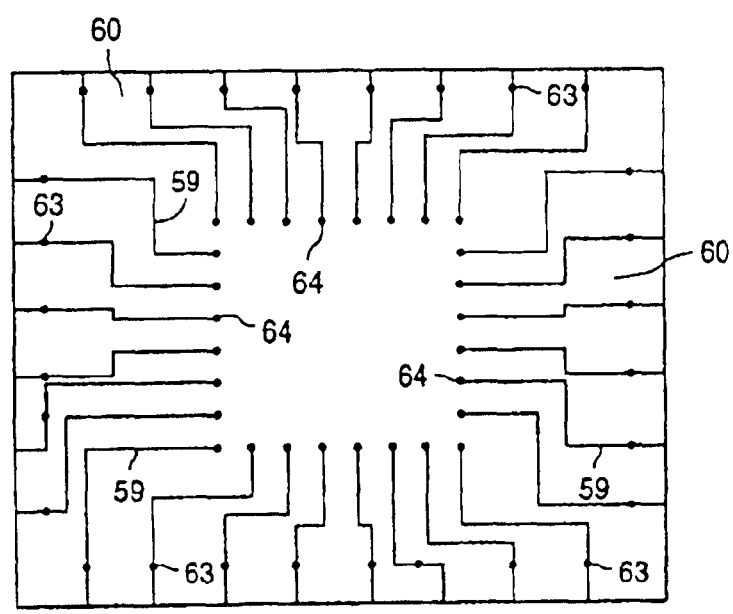
FIG. 11 is a plan view of packages 55 of FIG. 5 along line 11—11 of FIG. 5.

As in package 10 of FIG. 11, package 55 of FIG. 5 includes a planar metal die pad 11 and planar metal leads 14 at lower surface 27 of package 55. Lower second surface 19 of planar nonconductive sheet 17 is attached to upper first surface 12 of die pad 11 and upper first surface 15 of leads 14.

In package 55 of FIG. 5, planar metal traces 59 are on upper first surface 18 of nonconductive sheet 17. Each metal trace 59 includes an upper first surface 60 and an opposite lower second surface 61. Solder mask 21 covers upper first surface 60.

FIG. 11 is a plan view of package 55 along line 11—11 of FIG. 5, i.e., along upper first surface 60 of metal traces 59. As shown, each metal trace 59 extends from package side 28 toward the center of package 55, and terminates in a circular metal land 64. A metal via 63 connects to lower second surface 61 of each trace 59. An exemplary lower surface 27 of package 55 of FIG. 5 would be identical to the plan view shown in FIG. 1A, i.e., leads 14 and die pad 11 are exposed at lower surface 27.

Returning to FIG. 5, a vertical metal via 63 extends through an aperture in nonconductive sheet 17 and conductively connects second surface 61 of each trace 59 to a first surface 15 of a lead 14. A vertical metal via 63 through sheet 17 also conductively connects upper first surface 12 of die pad 17 to the backside of a land 64. Each bond pad 23 of flip chip device 56 is conductively connected by a solder ball 62 to a land 64. Bond pads 23 of flip chip device 56 of FIG. 5 are thereby conductively connected to leads 14 or die pad 11. In an exemplary use of package 55, leads 14 are conductively connected to signal or voltage sources on a printed circuit board, and die pad 11 is conductively connected to a ground voltage source on the printed circuit board.

Figure 6:
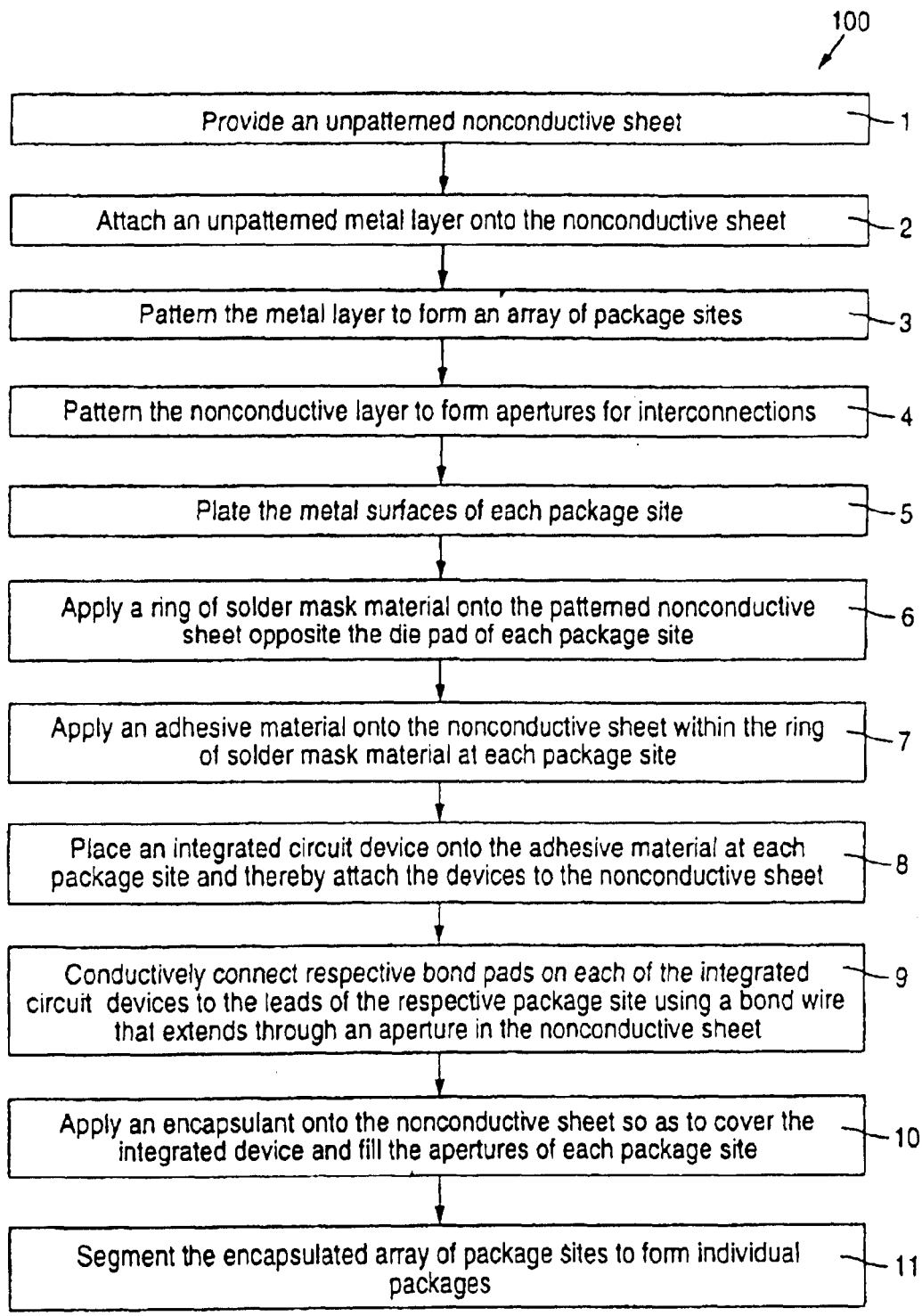
FIG. 6 is a flow chart of a method 100 of making package 10 of FIG. 1.

FIG. 6 is a flow chart of a method 100 within the present invention of making a package within the present invention. For purposes of example, method 100 of FIG. 6 is used to make a plurality of packages 10 of FIG. 1 simultaneously. FIGS. 7A–7E show a progressive flow of the assembly of package 10 of FIG. 1 according to method 100 of FIG. 6.

Figure 7A:
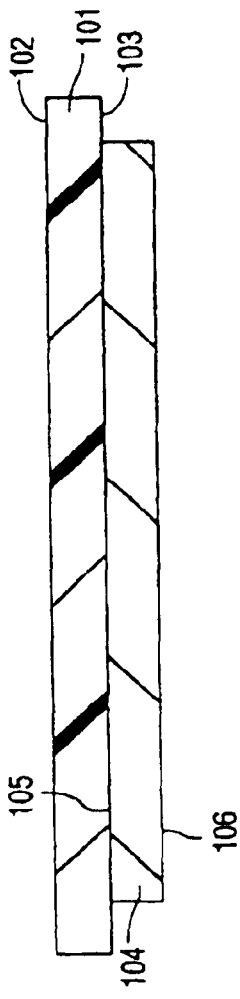
FIGS. 7A through 7E are cross-sectional side views of stages in the making of package 10 of FIG. 1 according to method 100 of FIG. 6.

Step 1 of method 100 of FIG. 6 provides an unpatterned nonconductive sheet 101. Sheet 101 is shown in FIG. 7A. Sheet 101 ultimately will form nonconductive sheet 17 of package 10 of FIG. 1, and thus is formed of the same materials described above for sheet 17. Sheet 101 includes an upper first surface 102 and an opposite lower second surface 103.

Step 2 of method 100 of FIG. 6 attaches an unpatterned metal layer 104, to nonconductive sheet 101, as shown in FIG. 7A. Metal layer 104 has an upper first surface 105 and an opposite lower second surface 106. First surface 105 of metal layer 104 is attached to lower second surface 103 of sheet 101. Metal layer 104 ultimately will form die pad 11 and leads 14 of package 10 of FIG. 1.

Metal layer 104 may be deposited on nonconductive sheet 101 using a sputtering or other metal deposition process. For example, if metal layer 104 is copper, Step 2 may be performed by sputtering layer of a seed metal, such as chromium, onto upper first surface 102 of nonconductive sheet 101, and then sputtering a layer of copper onto the seed metal layer. This method is associated with the 3M Company of Minnesota. Alternatively, metal layer 104 may be a metal sheet that is mechanically attached to second surface 103 of nonconductive sheet 101 using an adhesive.

Figure 8:
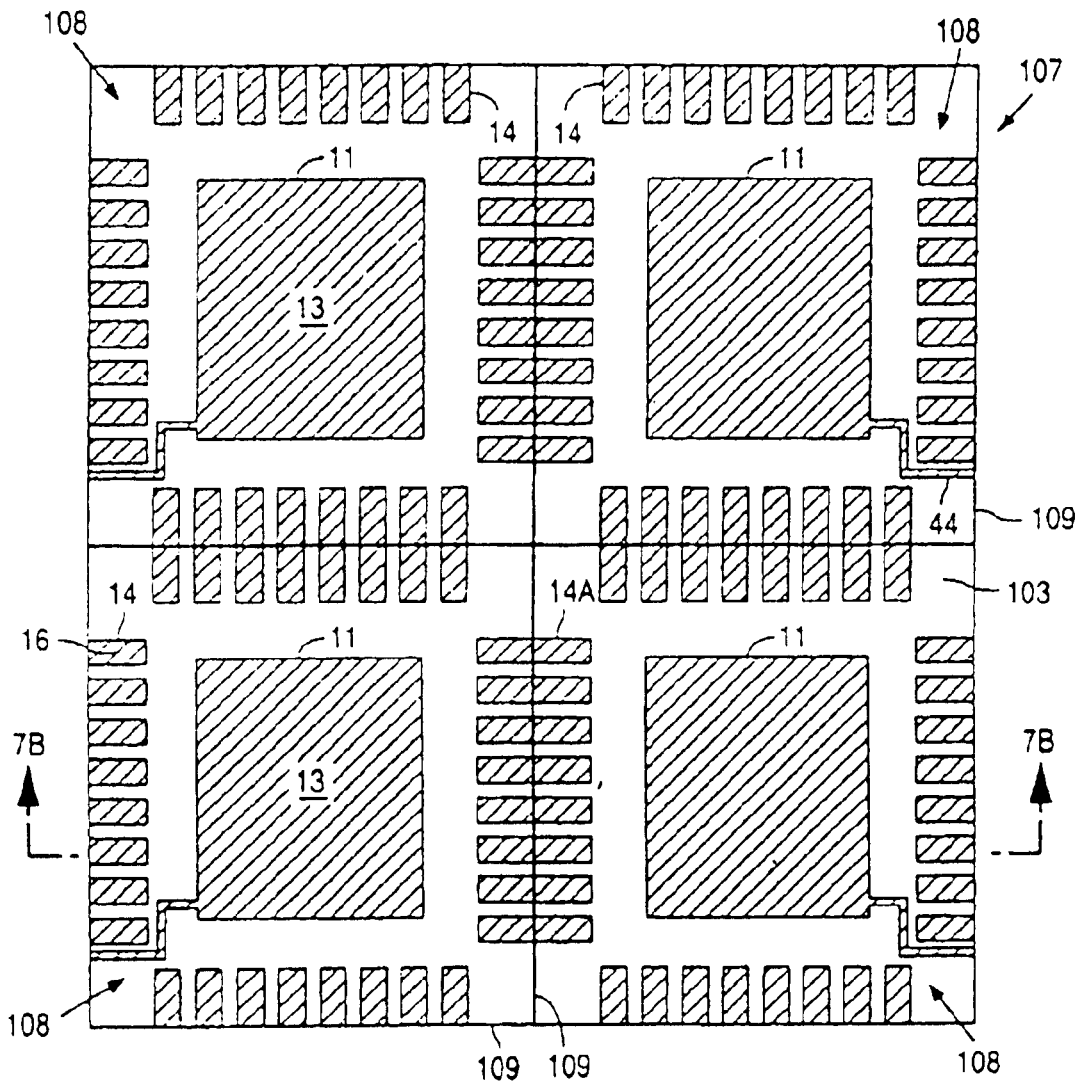
FIG. 8 is a plan view of a lower surface of an array 107 of four package sites 108. Each package site 108 includes a die pad 11 and leads 14 within a temporary metal frame.
Figure 7B:
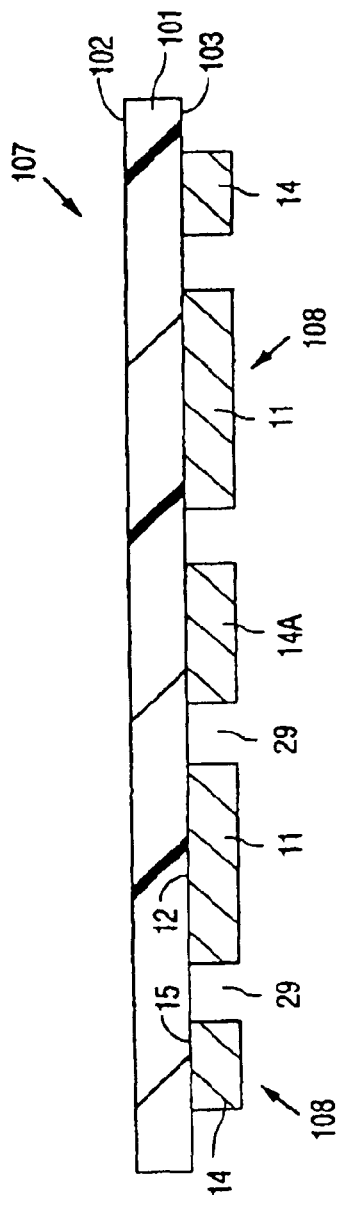
Figure 7C:
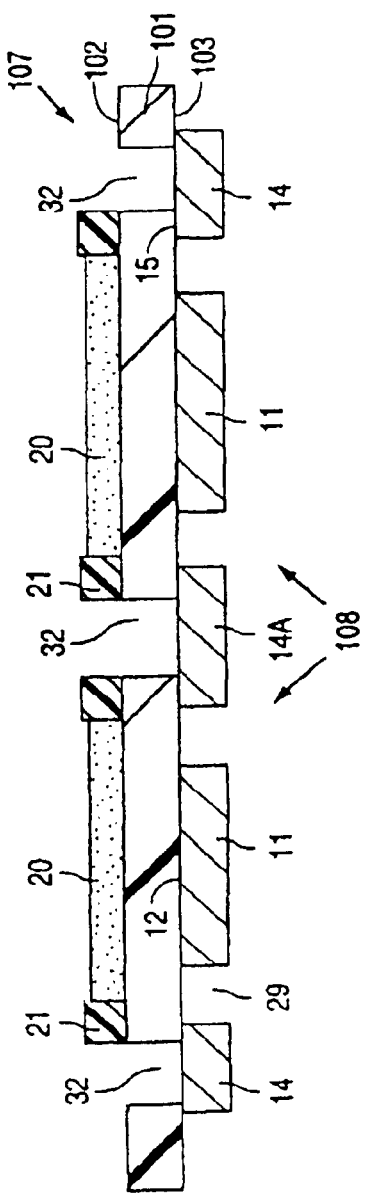

Step 3 method 100 of FIG. 6 patterns metal layer 104 to form an array 107 of joined package sites 108 (see FIGS. 7C and 8). Each package site 108 is a substrate for making a package 10 of FIG. 1. Step 3 forms die pad 11, leads 14, and plating trace 44 of FIG. 1A at each package site 108 of array 107.

FIG. 8 shows a two-by-two array 107 of four package sites 108 on lower second surface 103 of nonconductive sheet 101 of FIG. 7A after the completion of Step 3 of method 100 of FIG. 6. Shading is used to distinguish the metal portions of array 104. Second surface 103 of nonconductive sheet 101 is visible beneath the patterned metal layer. FIG. 7B is a cross-sectional view of array 107 of FIG. 8 along line 7B—7B.

Referring to FIG. 8, temporary metal strips 109 connect all of the leads 14 of array 107 and form a temporary square metal frame around each package site 108. Adjacent package sites 108 of array 107 share a metal strip 109 and a row of joined leads 14A. Later in method 100, when array 107 is segmented into individual packages 10 (FIG. 1), metal strips 109 are removed and joined leads 14A are bisected to form leads 14 of package 10 of FIG. 1.

A plating trace 44 connects each die pad 11 of array 107 to a metal strip 109. Plating trace 44 and strips 109 are useful when an electrolytic plating process is to be used to plate die pads 11 and leads 14. If an electrodeless plating process is used to plate the metal portions of array 107, then plating traces 44 and metal strips 109 may be omitted.

Figure 10:
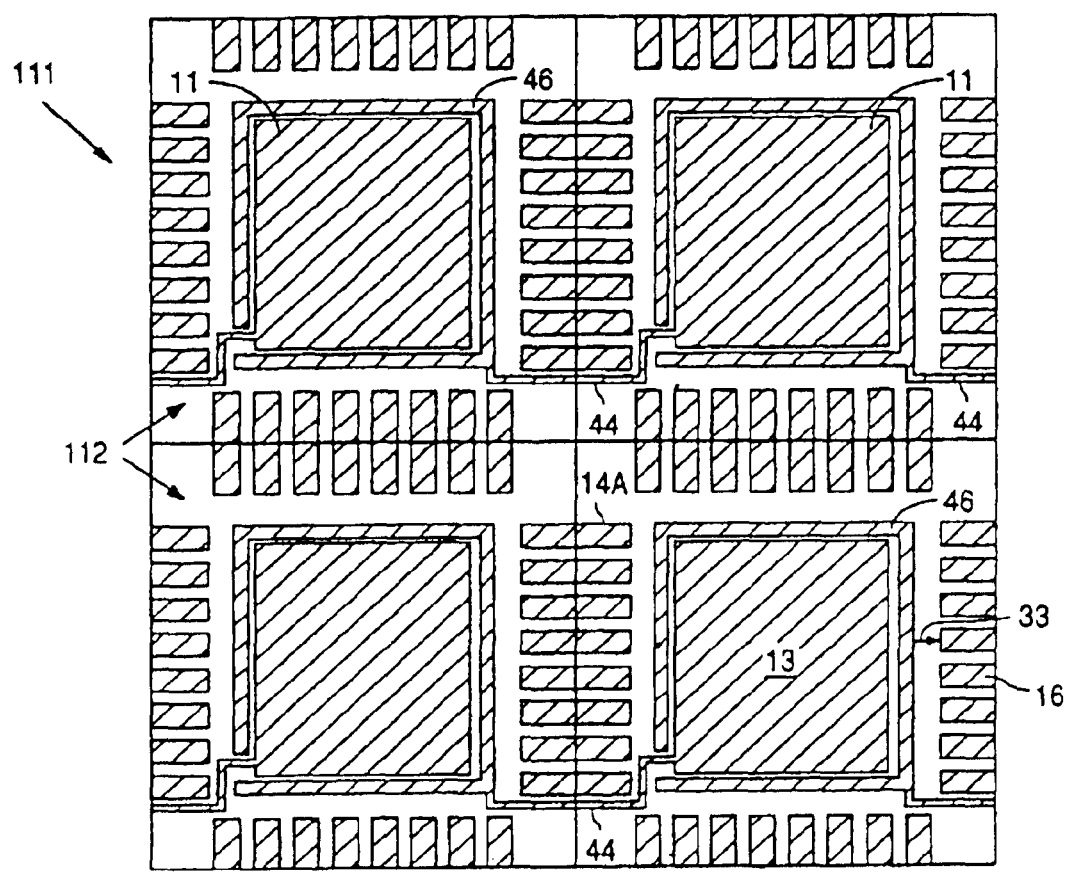
FIG. 10 is a plan view of a lower surface of an array 111 of package sites 112 for making four packages 45 of FIG. 4.

Step 3 of method 100 of FIG. 10 may be performed by a conventional chemical etching process. In such a process, a first step applies a layer of photoresist onto metal layer 104. A second step exposes the photoresist layer to light through a reticle. Subsequently, the exposed photoresist is developed, forming a patterned mask of photoresist material on metal layer 104. Next, a liquid etchant, typically an acid, is applied. The etchant dissolves metal that is not protected by photoresist, and thereby transfers the photoresist mask pattern into metal layer 104. Finally, the mask is removed.

Step 4 of method 100 of FIG. 6 patterns nonconductive sheet 101. FIG. 7C provides a cross-sectional view of a patterned nonconductive sheet 101. Step 4 forms hollow apertures 32 in sheet 101 at each package site 108. First surface 15 of each lead 14 is exposed for bond wire connection through an aperture 32.

The patterning of nonconductive sheet 101 to form apertures 32 during Step 4 of method 100 also may be performed by a conventional chemical etching process. Where sheet 17 is, for example, a polyimide film, Step 4 is performed by chemically etching sheet 17 in a basic solution, such as KOH, using a photoresist mask. The solution chosen to etch nonconductive sheet 101 should not etch metal layer 104, and vice versa. The order of Steps 3 and 4 of method 100 of FIG. 6 is reversible.

Referring to FIGS. 7B and 8, optional Step 5 of method 100 of FIG. 6 plates the portions of first surface 15 of leads 14 and 14A that are juxtaposed with aperture 32 in nonconductive sheet 101. Lower second surface 16 of leads 14 and 14A and lower second surface 13 of die pad 11 also may be plated. A typical plating metal for copper is nickel gold, which is used to enhance the connection of bond wires and solder. Conventional electrolytic or electrodeless plating processes are used.

Referring to FIGS. 1 and 7C, Step 6 of method 100 of FIG. 6 applies a ring of a conventional solder mask material 21 onto upper first surface 102 of sheet 101 at each package site 108 of array 107. Solder mask 21 is applied by screen printing or other conventional methods.

Figure 7D:
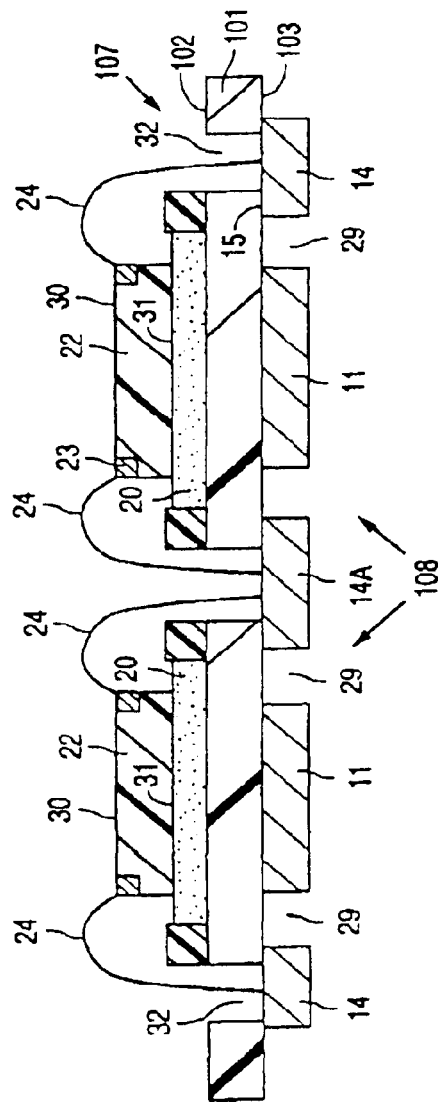

Referring to FIGS. 1 and 7C, Step 7 of method 100, of FIG. 6 applies a conventional adhesive 20, which may be a paste or film, onto upper first surface 102 of nonconductive sheet 101 within the ring of solder mask 21 at each package site 108. Step 8 of method 100 of FIG. 6 places an integrated circuit device 22 on adhesive 20 at each package site 108 of array 107. FIG. 7D shows a device 22 attached to each package site 108 of array 107. Steps 7 and 8 typically can be performed in a single conventional die attach machine. Curing of the adhesive is done if necessary.

Referring to FIGS. 1 and 7D, Step 9 of method of 100 of FIG. 6 forms a conductive connection between each bond pad 23 of each integrated circuit device 22 and a first surface 15 of a lead 14 or 14A of the respective package site 108 of array 104. In package 10 of FIG. 1, this conductive connection is formed by attaching a gold, copper, or other metal bond wire 24 between each bond pad 23 and a first surface 15 of a lead 14 through an aperture 32 in sheet 101. Conventional bond wire techniques are used.

Figure 7E:
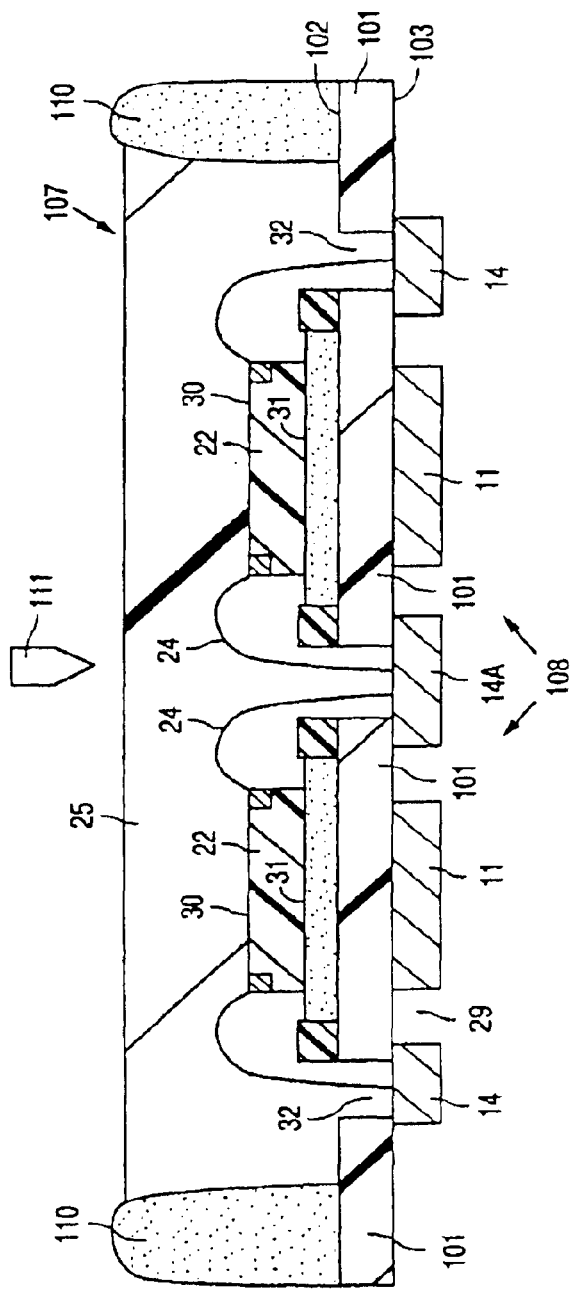

Referring to FIGS. 1 and 7E, Step 10 of method 100 of FIG. 6 applies an encapsulant material 25 onto upper first surface 102 of nonconductive sheet 101 so as to cover the integrated circuit device 22 and bond wires 24 of each package site 108 of array 107. In addition, apertures 32 are filled with encapsulant material 25. Encapsulant material 25 does not cover lower second surface 16 of leads 14 or 14A, lower second surface 13 of die pads 11, or lower second surface 103 of nonconductive sheet 101 of array 107.

One method of encapsulating array 103 is to use a conventional insulative liquid encapsulation technique. Referring to FIG. 7E, a bead 110 of an adhesive material is applied onto upper first surface 102 of nonconductive sheet 101 around the periphery of array 107. After this step, array 107 and each of its package sites 108 are within a cavity. Next, bead 110 is hardened. Subsequently, a liquid encapsulation material 25 is poured onto upper first surface 102 of sheet 101 within the cavity. Encapsulant material 25 fills apertures 32, and covers integrated circuit devices 22, bond wires 24, and the exposed portion of first surface 15 of leads 14 of each package site 108. Encapsulation material 25 is then hardened using a conventional curing process, such as by heating.

An alternative method of encapsulating array 107 of FIG. 7D is to use conventional molding techniques, such as injection or transfer molding, and conventional insulative molding materials. For example, array 107 of FIG. 7E may be molded by placing array 107 in a two-piece single-pocket mold that clamps around array 107. The upper mold die, which has the pocket, is placed above first surface 102 of sheet 101 and is filled with an moldable encapsulant material 25. Accordingly, the portion of array 107 above first surface 102 of nonconductive sheet 101 of array 107 is encapsulated in a single block of molded encapsulant material 25. The sides of the mold are tapered, as is customary. Alternatively, a mold die having an array of pockets, one for each package site 108 of array 107, could be used. The individual mold pockets would clamp around each package site 108 just inside of strips 106 (see FIG. 8). This alternative method would form an array of individual package bodies on array 107.

Step 11 of method 100 of FIG. 6 separates the package sites 108 of encapsulated array 107 to form individual packages 10. Referring to FIGS. 1, 1A, and 7E, one method of segmenting encapsulated array 107 is to invert array 107 and cut array 107 with a saw 111 along metal strips 109. Criss-crossing cuts are made. The saw blade is wider than strips 109, and thus obliterates strips 109. Joined leads 14A of adjacent package sites 108 are bisected to form individual leads 14. Plating traces 44 also are severed from metal strips 109. The cuts also form orthogonal package sides 28 of package 10 of FIG. 1. To aid in cutting, a sheet of adhesive film may applied onto the upper surface of encapsulation material 25 to hold the packages in place during the cutting operation. Alternatively, where array 107 is molded to form individual package bodies for each package site 108, then a punch may be used to separate individual packages 10 from encapsulated array 107.

Figure 9:
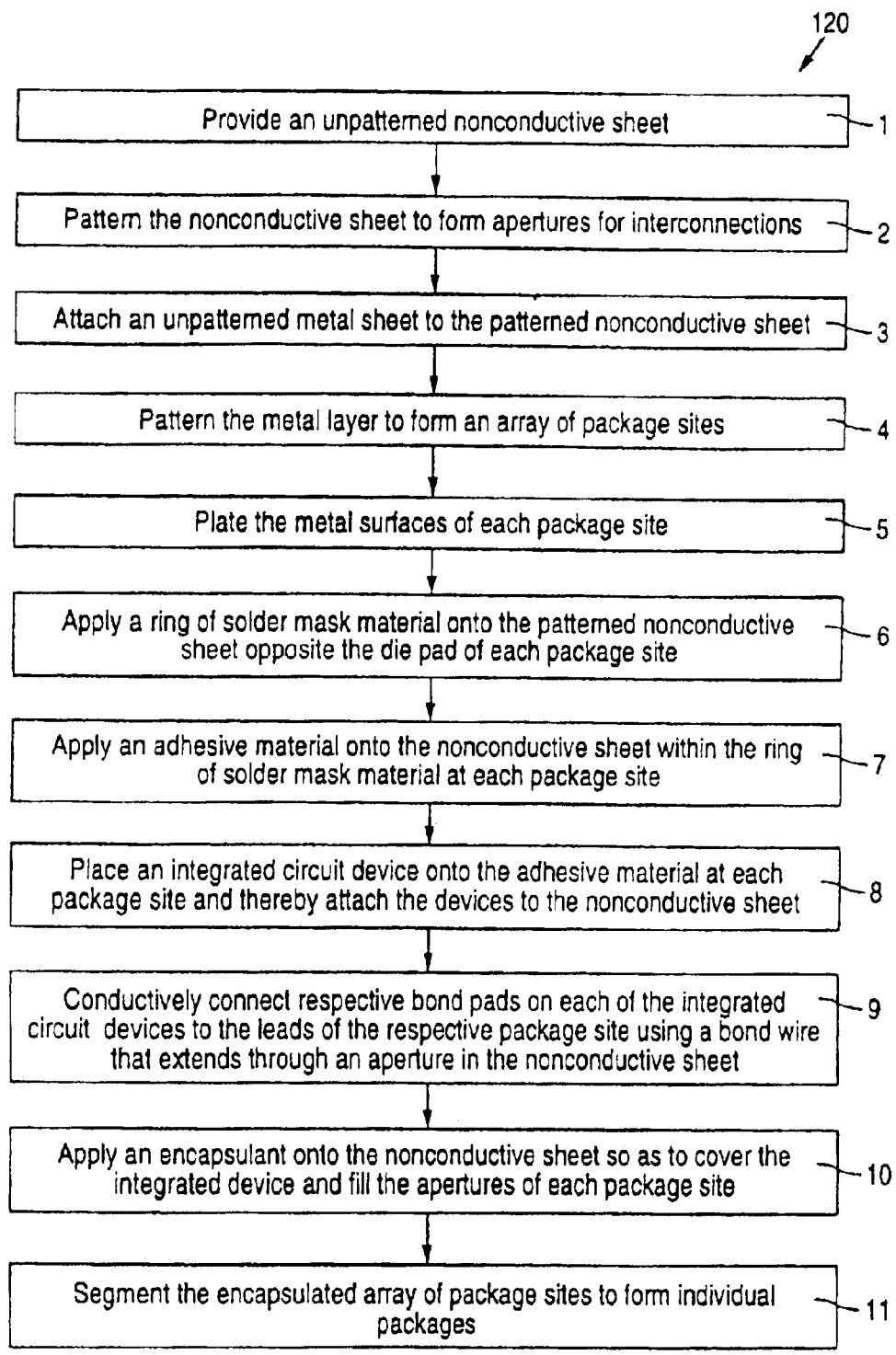
FIG. 9 is a flow chart of an alternate method 120 of making package 10 of FIG. 1.

Numerous variations of the above process are possible. An alternative method 120 within the present invention for making package 10 of FIG. 1 is shown in FIG. 9. Method 120 of FIG. 9 is similar to method 100 of FIG. 6, except in the initial steps. Step 1 of method 120 provides a nonconductive sheet 101. Step 2 of method 120 patterns nonconductive sheet 101 to form apertures 32. The patterning of nonconductive sheet 101 may be done by chemical etching, as described. above, or by conventional stamping or computer-aided drilling processes. Step 3 of method 120 provides an unpatterned pre-formed metal layer 104 and mechanically fastens the metal layer 104 to the patterned nonconductive sheet 101 using an adhesive. Step 4 of method 120 patterns metal layer 104 by etching as described above. Steps 5–11 of method 120 are the same as Steps 5–11 of method 100 of FIG. 6, and thus will not be discussed further.

Package 35 of FIG. 2 is made by a variation of method 100 of FIG. 6 or method 120 of FIG. 9. As discussed above, package 35 of FIG. 2 includes a plurality of small adhesive-filled apertures 39 in nonconductive sheet 17 between integrated circuit device 22 and die pad 11. If method 100 of FIG. 6 is used, then apertures 39 are formed during Step 4, when nonconductive sheet 101 is patterned by etching. Alternatively, if method 120 of FIG. 9 is used, then apertures 39 are formed during Step 2, when nonconductive sheet 101 is patterned by etching, stamping, or computer-aided drilling.

Package 40 of FIG. 3 is formed by a variation of method 100 of FIG. 6 or method 120 of FIG. 9. A distinction between package 40 of FIG. 3 and package 10. of FIG. 1 is the direct attachment of lower surface 31 of integrated circuit device 22 to first surface 12 of die pad 11 by adhesive 20. Device 22 and adhesive 20 are within a relatively large central aperture 42 in nonconductive sheet 17 (see FIG. 3). Aperture 42 is juxtaposed to first surface 12 of die pad 11 and has an area greater than the area of device 22. Aperture 42 is formed during Step 4 of method 100 of FIG. 6 or Step 2 of method 120 of FIG. 9 by the methods discussed above.

Package 45 of FIGS. 4 and 4A or 4B is formed by a variation of method 100 of FIG. 6 or method 120 of FIG. 9. A distinction between package 45 of FIG. 4 and package 40 of FIG. 3 is the addition of metal strip 46. (FIGS. 4 and 4A) or alternative metal strip 46A (FIG. 4B) between die pad 11 and leads 14. Metal strips 46 or 46A are formed by etching during Step 3 of method 100 of FIG. 6 or Step 4 of method 120 of FIG. 9. FIG. 10 is a plan view of an array 111 of package sites 112 having a metal strip 46, as shown in FIGS. 4 and 4A. Apertures 50 are formed in nonconductive sheet 17 during Step 4 of method 100 of FIG. 6 or Step 2 of method 120 of FIG. 9.

Package 55 of FIGS. 5 and 11 is formed by an alternative method within the present invention. As discussed above, package 55 includes metal traces 59 and lands 64 on upper first surface 18 of nonconductive sheet 17. Package 55 also includes vertical metal vias 63 through nonconductive sheet 17.

Figure 12:
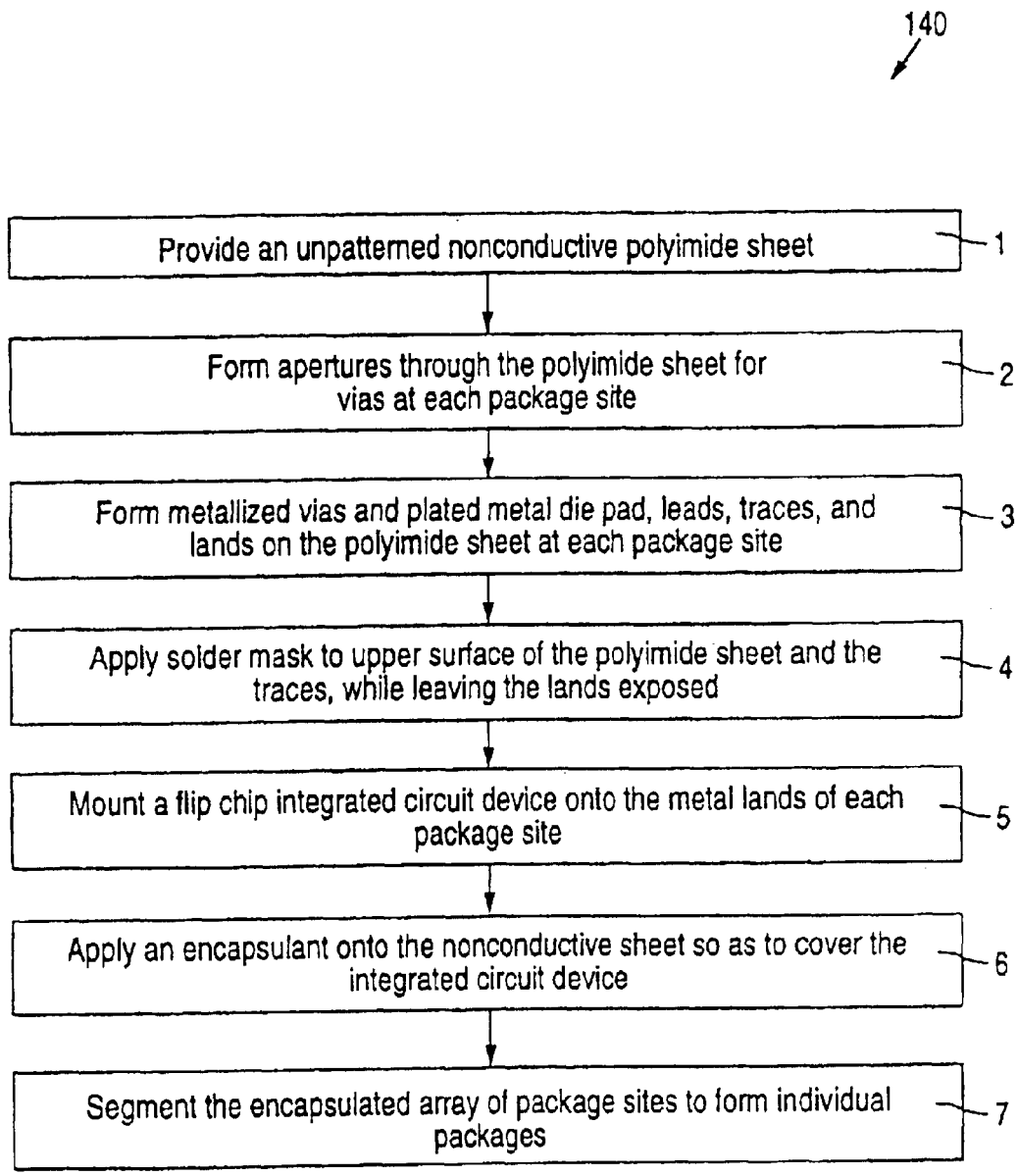
FIG. 12 is a flow chart of a method 140 of making a package 55 of FIG. 5.
Figure 13A:
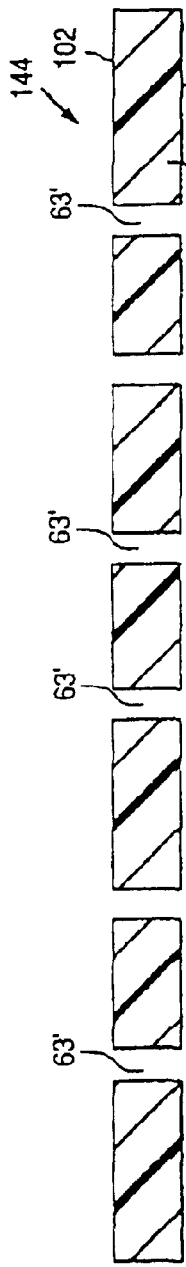
FIGS. 13A through 13C are cross-sectional side views of stages in the making of package 55 of FIGS. 5 and 11 according to method 140 of FIG. 12.
Figure 13B:
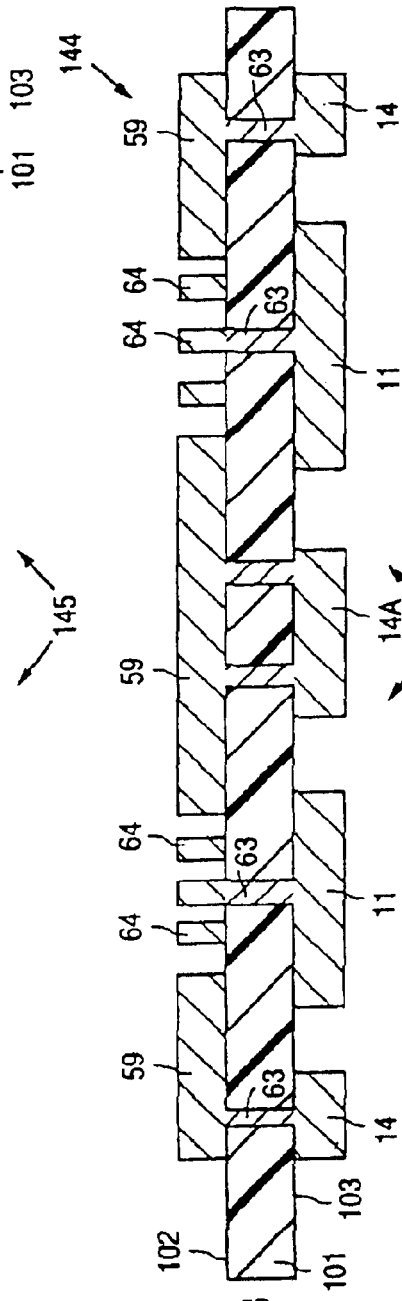
Figure 13C:
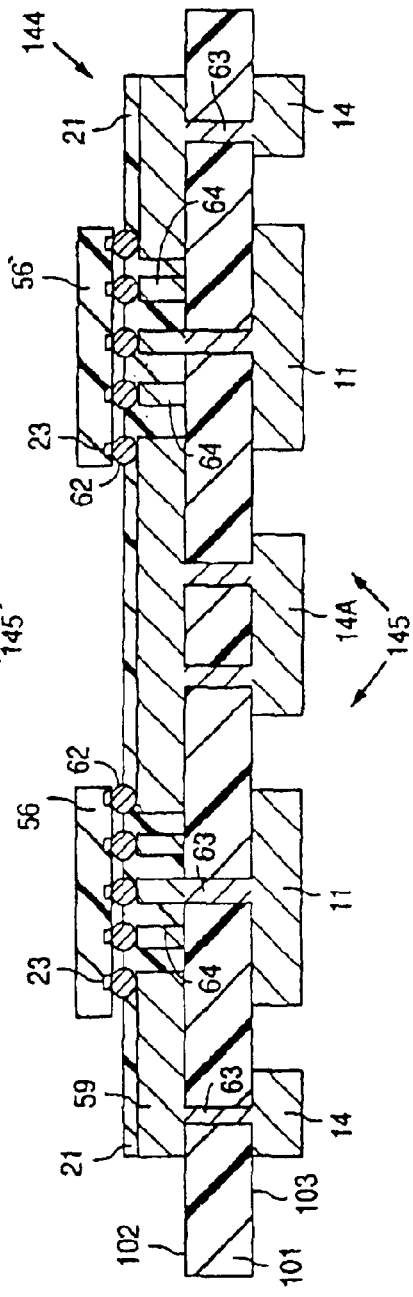

FIG. 12 is a flow chart of an exemplary method 140 of making package 55 of FIG. 5. In particular, method 140 uses a polyimide sheet as nonconductive sheet 101. FIGS. 13A-*c* show selected stages in the method.

Referring to FIGS. 5 and 13A, Step 1 of method 140 provides a unpatterned polyimide nonconductive sheet 101 for creating an array 144 of package sites 145 thereon. A package ultimately is formed at each package site 145. Step 2 patterns the polyimide sheet 101 to form apertures 63' for vias 63 at each package site 145. As an example, a computer aided laser drilling technique could be used for Step 2.

Referring to FIGS. 5 and 13B, Step 3 forms metal vias 63, and plated die pads 11, leads 14, joined leads 14A, metal traces 59 and lands 64 on polyimide sheet 101. Step 3 may be performed by, first, forming field metal layers on upper first surface 101 and lower second surface 102 of polyimide sheet 101, and filling or ringing the apertures in polyimide sheet 101 with metal to form vias 63. The field metal layers may be formed of copper with the use of a seed metal, e.g., chromium. A sputtering, evaporation, or other deposition processes may be used. Next, patterned photoresist masks are formed on the upper and lower metal layers to define the metal features of the package site, such as die pads 11, leads 14, joined leads 14A, metal traces 59 and lands 64. Additional copper is then plated or otherwise applied to the masked polyimide sheet, building up the desired metal structures. Next, nickel and gold are plated onto the copper of die pads 11, leads 14, joined leads 14A, metal traces 59 and lands 64. After the resist is removed, the field copper is etched back. The nickel and gold plating essentially serves as a mask for the desired metal patterns.

Step 4 applies solder mask material 21 to upper first surface 142 of second metal layer 141 so as to cover traces 59, but leave lands 64 exposed. Screen printing may be used for Step 4.

Referring to FIGS. 5, 11, and 13C, Step 5 of method 140 mounts a flip chip device 56 onto lands 64 and forms a solder connection 62 between each bond pad 23 of flip chip device 56 and a land 64. Underfill may be applied between the solder connections. Step 6 encapsulates each flip chip device 56 and package site 145, as shown in FIG. 5. Conventional liquid encapsulation or molding techniques and materials may be used. Step 7 separates individual packages 55 from the array, similar to Step 11 of method 100 of FIG. 6.

Figure 14:
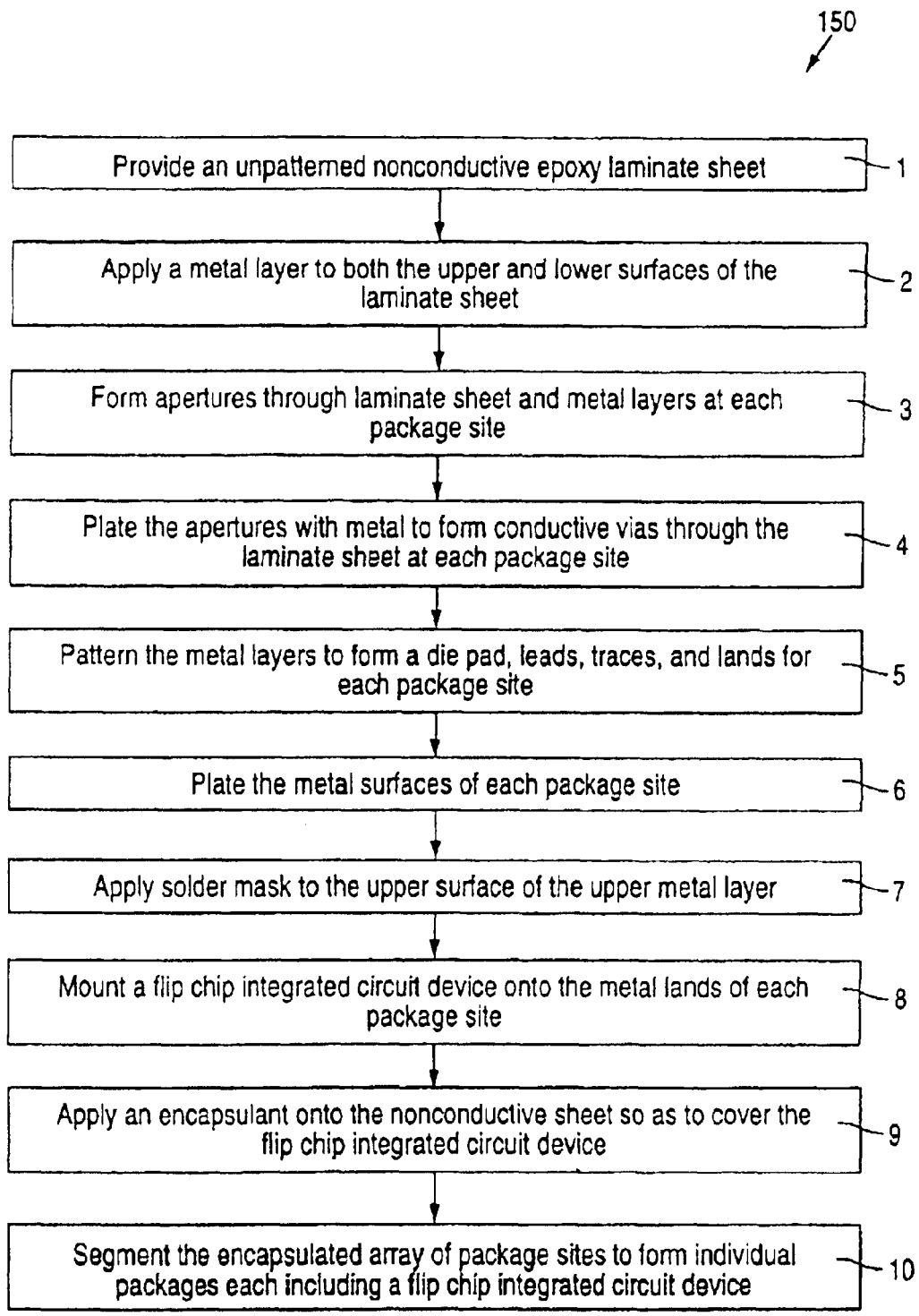
FIG. 14 is a flow chart of an alternative method 150 of making a package 55 of FIG. 5.
Figure 15A:
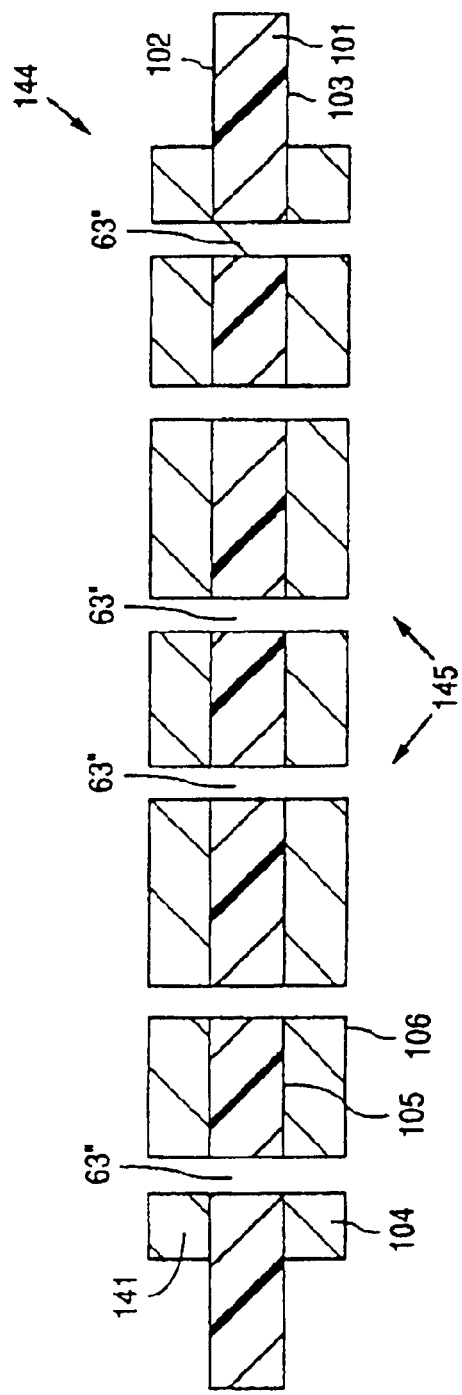
FIGS. 15A through 15B are cross-sectional side views of stages in the making of package 55 of FIGS. 5 and 11 according to method 150 of FIG. 14.

FIG. 14 is a flow chart of an alternative exemplary method 150 of making package 55 of FIG. 5. In particular, the method 150 uses an epoxy laminate material as nonconductive sheet 101. Method 150 is has similarities with method 140 of FIG. 12, and thus needs only brief discussion. Referring to FIG. 15A, Step 1 provides an epoxy laminate sheet 101. Step 2 applies first metal layer 104 and second metal layer 141 to laminate sheet 101 using conventional printed circuit board techniques. Step 3 forms apertures 63" (e.g., by drilling) through the metal layers 104 and 141 and epoxy laminate sheet 101 for forming vias 63 at each package site 145. A conventional drilling technique may be used.

Figure 15B:
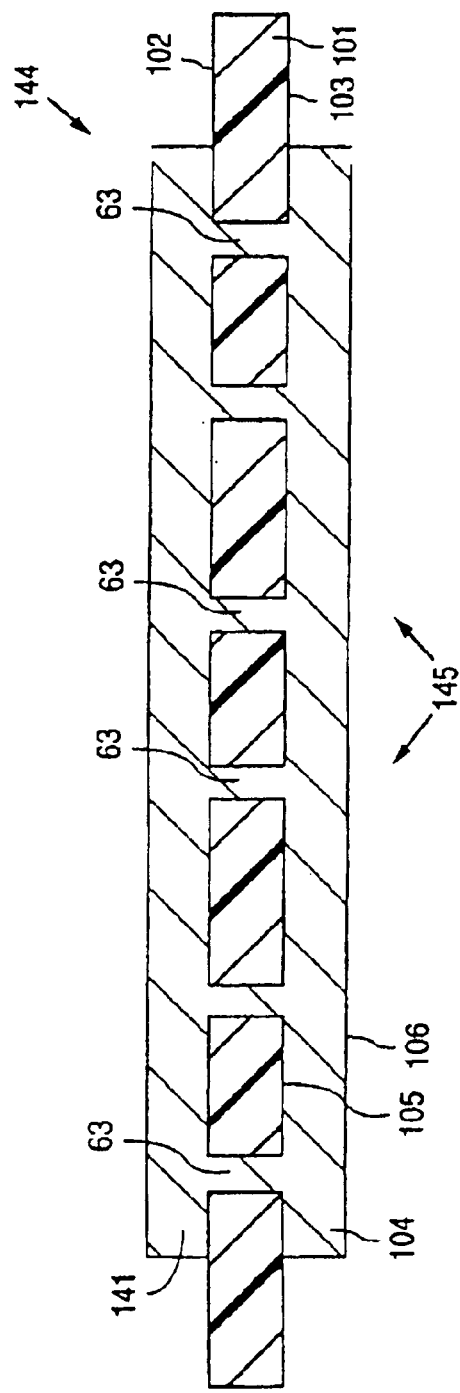

Referring to FIG. 15B, Step 4 of method 150 plates the insides of apertures 63" with metal, forming vias 63 at each package site 145. Step 5 patterns metal layers 104 and 141 using, for example, a chemical etching process, to form die pads 11, leads 14, joined leads 14A, metal traces 59 and lands 64. Step 6 plates the metal features of each package site 145, e.g., with nickel and gold. Steps 7–10 of method 150 are the same as Steps 4–7 of method 140 of FIG. 12, and are not discussed further.

The embodiments described herein are merely examples of the present invention. Artisans will appreciate that variations are possible within the scope of the claims.

What is claimed is:

1. An integrated circuit device package comprising:
    a planar nonconductive sheet having a first surface and an opposite second surface;
    a planar metal die pad having a first surface and an opposite second surface, wherein the first surface of the die pad is attached to the second surface of the nonconductive sheet;
    a plurality of planar metal leads each having a first surface and an opposite second surface, wherein each lead is attached to the second surface of the nonconductive sheet and the leads extend from a perimeter of the package toward the die pad;
    a plurality of metallizations on the first surface of the non-conductive sheet, wherein each metallization includes a first end and is conductively connected to the first surface of a lead through the nonconductive sheet; and
    an integrated circuit device having a plurality of conductive pads, wherein each of the pads is juxtaposed with and conductively connected to a first end of a metallization at a first connection;
    an encapsulating material on the first surface of the nonconductive sheet, wherein the encapsulating material covers the integrated circuit device and the first connections; and
    wherein the second surfaces of the die pad and leads are exposed at an exterior surface of the package.

2. The package of claim 1, further comprising a conductive connection between the die pad and a pad of the integrated circuit device through an aperture in said nonconductive sheet.

3. The package of claim 1, further comprising a planar metal strip located adjacent to and between the die pad and at least one of the leads;
    wherein a first surface of the metal strip is attached to the second surface of the nonconductive sheet.

4. An integrated circuit device package comprising:
    a nonconductive sheet defining opposed first and second sheet surfaces;
    a die pad defining opposed first and second die pad surfaces, the first die pad surface being attached to the second sheet surface;
    a plurality of leads each defining opposed first and second lead surfaces, the first lead surface of each of the leads being attached to the second sheet surface such that the leads at least partially circumvent the die pad;
    a plurality of traces disposed on the first sheet surface, each of the traces being electrically connected to a respective one of the leads and defining a land;
    an integrated circuit device having a plurality of conductive pads which are electrically connected to respective ones of the lands; and
    an encapsulating material at least partially encapsulating the integrated circuit device, the nonconductive sheet, the leads, and the traces such that the second lead surfaces and second die pad surface are exposed at an exterior surface of the package.

5. The package of claim 4 wherein at least one of the traces is electrically connected to the die pad.

6. The package of claim 5 wherein the electrical connection of the die pad to at least one of the traces is facilitated by a conductive via which extends through the nonconductive sheet from the first die pad surface to a respective one of the lands.

7. The package of claim 4 wherein:
    each of the traces defines opposed first and second trace surfaces, the second trace surface of each of the traces being attached to the first sheet surface; and
    each of the leads is electrically connected to a respective one of the traces by a conductive via which extends through the nonconductive sheet from the first lead surface to the second trace surface.

8. The package of claim 7 wherein at least a portion of the first trace surface of each of the traces is covered by a solder mask.

9. The package of claim 4 further comprising an elongate strip attached to the second surface and extending between the die pad and at least one of the leads.

10. The package of claim 4 wherein the conductive pads of the integrated circuit device are juxtaposed with respective ones of the lands and electrically connected thereto through the use of solder balls.

11. An integrated circuit package, comprising:
    a planar nonconductive sheet having a first surface and an opposite second surface;
    a planar metal die pad, wherein the die pad has a first surface attached to the second surface of the nonconductive sheet;
    a plurality of planar metal leads each having a first surface and an opposite second surface, wherein the first surface of each lead is attached to the second surface of the nonconductive sheet and the leads are adjacent to the die pad;
    a plurality of metallizations on the first surface of the nonconductive sheet, wherein each metallization defines a land and is conductively connected to the first surface of a respective one of the leads by a metallized via through the nonconductive sheet;
    an integrated circuit device having a plurality of conductive pads which are each electrically connected to a respective one of the lands; and
    an encapsulating material at least partially covering the integrated circuit device, the nonconductive sheet, the leads, and the metallizations such that the second surfaces of the leads are exposed at an exterior surface of the package.

12. The package of claim 11, wherein the die pad is conductively connected to one of the lands by a metallized via through the nonconductive sheet.

13. An integrated circuit package, comprising:
    a nonconductive sheet defining opposed first and second sheet surfaces and a plurality of conductive vias extending between the first and second sheet surfaces;
    a die pad defining opposed first and second die pad surfaces, the first die pad surface being attached to the second sheet surface;

a plurality of leads each defining opposed first and second lead surfaces, the first lead surface of each of the leads being attached to the second sheet surface such that the leads at least partially circumvent the die pad;

a plurality of traces disposed on the first sheet surface, each of the traces being electrically connected to a respective one of the leads by a respective one of the conductive vias;

an integrated circuit device having a plurality of conductive pads which are each electrically connected to a respective one of the lands; and an encapsulating material at least partially covering the integrated circuit device, the nonconductive sheet, the leads, and the traces such that the second lead surfaces and second die pad surface are exposed at an exterior surface of the package.

14. The package of claim 13 wherein at least one of the traces is electrically connected to the die pad by at least one of the conductive vias.

15. The package of claim 14 wherein:

each of the traces defines a land; and the electrical connection of the die pad to at least one of the traces is facilitated by at least one of the conductive vias which extends through the conductive sheet from the first die pad surface to a respective one of the lands.

16. The package of claim 13 wherein:

each of the traces defines opposed first and second trace surfaces, the second trace surface of each of the traces being attached to the first sheet surface; and each of the leads is electrically connected to a respective one of the traces by a conductive via which extends through the nonconductive sheet from the first lead surface to the second trace surface.

17. The package of claim 16 wherein at least a portion of the first trace surface of each of the traces is covered by a solder mask.

18. The package of claim 13 further comprising an elongate strip attached to the second sheet surface and extending between the die pad and at least one of the leads.

* * * * *